(12) United States Patent
Natarajan et al.

(10) Patent No.: US 7,715,080 B2
(45) Date of Patent: May 11, 2010

(54) PACKAGING A MEMS DEVICE USING A FRAME

(75) Inventors: Bangalore R. Natarajan, Cupertino, CA (US); Lauren Palmateer, San Francisco, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 62 days.

(21) Appl. No.: 11/735,362

(22) Filed: Apr. 13, 2007

(65) Prior Publication Data

US 2007/0242345 A1    Oct. 18, 2007

Related U.S. Application Data

(60) Provisional application No. 60/791,730, filed on Apr. 13, 2006.

(51) Int. Cl.
G02F 1/03    (2006.01)
G02B 26/00   (2006.01)

(52) U.S. Cl. ..................... 359/245; 359/290

(58) Field of Classification Search .......... 359/245, 359/290
See application file for complete search history.

(56) References Cited

U.S. PATENT DOCUMENTS

| | | |
|---|---|---|
| 3,704,806 A | 12/1972 | Plachenov et al. |
| 3,900,440 A | 8/1975 | Ohara et al. |
| 4,036,360 A | 7/1977 | Deffeyes |
| 4,074,480 A | 2/1978 | Burton |
| 4,431,691 A | 2/1984 | Greenlee |
| 4,531,126 A | 7/1985 | Sadones |
| 4,552,806 A | 11/1985 | Hayashi et al. |
| 4,950,344 A | 8/1990 | Glover et al. |
| 4,954,789 A | 9/1990 | Sampsell |
| 4,977,009 A | 12/1990 | Anderson et al. |
| 5,018,256 A | 5/1991 | Hornbeck |
| 5,075,796 A | 12/1991 | Schildkraut et al. |
| 5,091,983 A | 2/1992 | Lukosz |
| 5,095,375 A | 3/1992 | Bolt |
| 5,099,353 A | 3/1992 | Hornbeck |
| 5,172,262 A | 12/1992 | Hornbeck |
| 5,212,582 A | 5/1993 | Nelson |
| 5,216,537 A | 6/1993 | Hornbeck |

(Continued)

FOREIGN PATENT DOCUMENTS

EP        1 093 162       4/2001

(Continued)

OTHER PUBLICATIONS

Invitation to Pay Additional Fees for PCT/US07/009271 filed Apr. 12, 2007.

(Continued)

Primary Examiner—Jordan M. Schwartz
Assistant Examiner—James C Jones
(74) Attorney, Agent, or Firm—Knobbe Martens Olson & Bear LLP

(57) ABSTRACT

A package structure and method of packaging for a MEMS device is described. A transparent substrate having an interferometric modulator array formed thereon is shown. A single or dual-layered backplate is joined to a frame that circumscribes the modulator array. The frame is bonded to the transparent substrate and to the backplate to provide a hermetic package.

36 Claims, 9 Drawing Sheets

U.S. PATENT DOCUMENTS

| | | | |
|---|---|---|---|
| 5,244,707 A | 9/1993 | Shores | |
| 5,293,511 A | 3/1994 | Poradish et al. | |
| 5,304,419 A | 4/1994 | Shores | |
| 5,381,253 A | 1/1995 | Sharp et al. | |
| 5,547,823 A | 8/1996 | Murasawa et al. | |
| 5,550,373 A | 8/1996 | Cole et al. | |
| 5,553,440 A | 9/1996 | Bulger et al. | |
| 5,559,358 A | 9/1996 | Burns et al. | |
| 5,591,379 A | 1/1997 | Shores | |
| 5,646,729 A | 7/1997 | Koskinen et al. | |
| 5,703,710 A | 12/1997 | Brinkman et al. | |
| 5,739,945 A | 4/1998 | Tayebati | |
| 5,815,141 A | 9/1998 | Phares | |
| 5,835,255 A | 11/1998 | Miles | |
| 5,853,662 A | 12/1998 | Watanabe | |
| 5,939,785 A | 8/1999 | Klonis et al. | |
| 5,986,796 A | 11/1999 | Miles | |
| 6,040,937 A | 3/2000 | Miles | |
| 6,055,090 A | 4/2000 | Miles | |
| 6,238,755 B1 | 5/2001 | Harvey et al. | |
| 6,355,328 B1 | 3/2002 | Baratuci et al. | |
| 6,455,927 B1 | 9/2002 | Glenn et al. | |
| 6,467,139 B1 | 10/2002 | Tanaka | |
| 6,489,670 B1 | 12/2002 | Peterson et al. | |
| 6,495,895 B1 | 12/2002 | Peterson et al. | |
| 6,538,312 B1 | 3/2003 | Peterson et al. | |
| 6,582,789 B1 | 6/2003 | Sumi | |
| 6,589,625 B1 | 7/2003 | Kothari et al. | |
| 6,603,182 B1 | 8/2003 | Low et al. | |
| 6,621,134 B1 | 9/2003 | Zurn | |
| 6,650,455 B2 | 11/2003 | Miles | |
| 6,661,084 B1 | 12/2003 | Peterson et al. | |
| 6,674,159 B1 | 1/2004 | Peterson et al. | |
| 6,674,562 B1 | 1/2004 | Miles et al. | |
| 6,680,792 B2 | 1/2004 | Miles | |
| 6,709,750 B1 | 3/2004 | Pohlmann et al. | |
| 6,743,656 B2 | 6/2004 | Orcutt et al. | |
| 6,791,660 B1 | 9/2004 | Hayashi et al. | |
| 6,838,309 B1 | 1/2005 | McCann | |
| 6,867,896 B2 | 3/2005 | Miles | |
| 6,872,984 B1 | 3/2005 | Leung | |
| 6,999,225 B2 | 2/2006 | Lin et al. | |
| 7,012,726 B1 | 3/2006 | Miles | |
| 7,012,732 B2 | 3/2006 | Miles | |
| 7,015,885 B2 | 3/2006 | Novotny et al. | |
| 7,034,984 B2 | 4/2006 | Pan et al. | |
| 7,042,643 B2 | 5/2006 | Miles | |
| 7,119,945 B2 | 10/2006 | Kothari et al. | |
| 7,123,216 B1 | 10/2006 | Miles | |
| 7,126,741 B2 | 10/2006 | Wagner et al. | |
| 7,130,104 B2 | 10/2006 | Cummings | |
| 7,136,213 B2 | 11/2006 | Chui | |
| 7,138,984 B1 | 11/2006 | Miles | |
| 7,142,346 B2 | 11/2006 | Chui et al. | |
| 7,164,520 B2 | 1/2007 | Palmateer et al. | |
| 7,218,438 B2 | 5/2007 | Przybyla | |
| 7,317,281 B2 | 1/2008 | Hayashi et al. | |
| 7,385,748 B2 | 6/2008 | Miles | |
| RE40,436 E | 7/2008 | Kothari et al. | |
| 7,471,444 B2 | 12/2008 | Miles | |
| 7,518,775 B2 | 4/2009 | Miles et al. | |
| 2002/0000649 A1 | 1/2002 | Tilmans et al. | |
| 2002/0056900 A1 | 5/2002 | Liu et al. | |
| 2002/0075551 A1 | 6/2002 | Daneman | |
| 2002/0075555 A1 | 6/2002 | Miles | |
| 2002/0121909 A1 | 9/2002 | Sato et al. | |
| 2002/0126364 A1 | 9/2002 | Miles | |
| 2002/0160583 A1 | 10/2002 | Song | |
| 2002/0187254 A1 | 12/2002 | Ghosh | |
| 2003/0053233 A1 | 3/2003 | Felton | |
| 2003/0054588 A1 | 3/2003 | Patel et al. | |
| 2003/0062186 A1 | 4/2003 | Boroson et al. | |
| 2003/0075794 A1 | 4/2003 | Felton et al. | |
| 2003/0103185 A1 | 6/2003 | Kim et al. | |
| 2003/0104651 A1 | 6/2003 | Kim et al. | |
| 2003/0108306 A1 | 6/2003 | Whitney et al. | |
| 2003/0143423 A1 | 7/2003 | McCormick et al. | |
| 2003/0155643 A1 | 8/2003 | Freidhoff | |
| 2003/0183916 A1 | 10/2003 | Heck et al. | |
| 2003/0184412 A1 | 10/2003 | Gorrell | |
| 2003/0214007 A1 | 11/2003 | Tao et al. | |
| 2004/0048037 A1 | 3/2004 | Klausmann et al. | |
| 2004/0061492 A1 | 4/2004 | Lopes et al. | |
| 2004/0066258 A1 | 4/2004 | Cohn et al. | |
| 2004/0070706 A1 | 4/2004 | Freeman | |
| 2004/0100677 A1 | 5/2004 | Huibers et al. | |
| 2004/0140557 A1 | 7/2004 | Sun et al. | |
| 2004/0166603 A1 | 8/2004 | Carley | |
| 2004/0184133 A1 | 9/2004 | Su et al. | |
| 2005/0023976 A1 | 2/2005 | Wang | |
| 2005/0035699 A1 | 2/2005 | Tsai | |
| 2005/0036192 A1 | 2/2005 | Lin et al. | |
| 2005/0042117 A1 | 2/2005 | Lin | |
| 2005/0046919 A1 | 3/2005 | Taguchi et al. | |
| 2005/0046922 A1 | 3/2005 | Lin et al. | |
| 2005/0074919 A1 | 4/2005 | Patel et al. | |
| 2005/0093134 A1 | 5/2005 | Tarn | |
| 2005/0167795 A1 | 8/2005 | Higashi | |
| 2005/0174048 A1 | 8/2005 | Matsukaze | |
| 2005/0253283 A1 | 11/2005 | Dcamp et al. | |
| 2006/0066935 A1 | 3/2006 | Cummings et al. | |
| 2006/0076631 A1 | 4/2006 | Palmateer et al. | |
| 2006/0076634 A1 | 4/2006 | Palmateer et al. | |
| 2006/0076637 A1 | 4/2006 | Gally | |
| 2006/0077126 A1 | 4/2006 | Kothari | |
| 2006/0077145 A1 | 4/2006 | Floyd | |
| 2006/0077503 A1 | 4/2006 | Palmateer et al. | |
| 2006/0079098 A1 | 4/2006 | Floyd | |
| 2006/0152106 A1 | 7/2006 | Yan et al. | |
| 2006/0197215 A1 | 9/2006 | Potter | |
| 2007/0064295 A1 | 3/2007 | Faase et al. | |
| 2007/0097477 A1 | 5/2007 | Miles | |
| 2007/0139655 A1 | 6/2007 | Luo | |
| 2007/0298541 A1 | 12/2007 | Floyd | |
| 2008/0018783 A1 | 1/2008 | Wang et al. | |
| 2008/0038876 A1 | 2/2008 | Floyd | |
| 2008/0112036 A1* | 5/2008 | Cummings | 359/290 |
| 2009/0189230 A1 | 7/2009 | Palmateer et al. | |

FOREIGN PATENT DOCUMENTS

| | | |
|---|---|---|
| EP | 1 418 154 A2 | 5/2004 |
| EP | 1 640 320 | 3/2006 |
| EP | 1 640 337 | 3/2006 |
| EP | 1 640 772 | 3/2006 |
| EP | 1 640 775 | 3/2006 |
| FR | 2841380 | 12/2003 |
| JP | 59-6842 | 1/1984 |
| JP | 04-085859 | 3/1992 |
| JP | 11-145337 | 5/1999 |
| WO | WO 01/45140 | 6/2001 |
| WO | WO 02/42716 A2 | 5/2002 |
| WO | WO 03/007049 A1 | 1/2003 |
| WO | WO 03/009318 | 1/2003 |
| WO | WO 03/026369 A1 | 3/2003 |
| WO | WO 03/105198 | 12/2003 |
| WO | WO 2004/025727 | 3/2004 |
| WO | WO 2005/110914 A1 | 11/2005 |
| WO | WO 2005/114294 A1 | 12/2005 |

OTHER PUBLICATIONS

ISR and WO for PCT/US07/009275 filed Apr. 12, 2007.

Jung et al., Soldered sealing process to assemble a protective cap for a MEMS CSP, Design, Test, Integration and Packaging of MEMS/MOEMS 2003 Symposium, pp. 255-260.

Kim et al., Fabrication and characterization of a low-temperature hermetic MEMS package bonded by a closed loop AuSn solder-line, Proceedings of the IEEE 16th Annual International Conference on Micro Electro Mechanical Systems, Jan. 2003, pp. 614-617.

Maharbiz et al., Batch micropackaging by compression-bonded wafer-wafer transfer, Twelfth IEEE International Conference on Micro Electro Mechanical Systems, Jan. 17-21, 1999, pp. 482-489.

Tao et al., Selective Bonding and encapsulation for wafer-level vacuum packaging of mems and related micro systems, Microelectronics and Reliability, 44(2):251-258, Feb. 2004.

Tilmans et al., The indent reflow sealing (IRS) technique-A method for the fabrication of sealed cavities for mems devices, Journal of Microelectromechanical Systems, 9(2), Jun. 2000.

Tominetti, et al., Moisture and impurities detection and removal in packaged MEMS, Proceedings of the SPIE, Reliability, Testing and Characterization of MEMS/MOEMS, Oct. 2001, pp. 215-225.

Yang et al., Localized induction heating solder bonding for wafer level MEMS packaging, 17th IEEE International Conference on Micro Electro Mechanical Systems, Jan. 2004, pp. 729-732.

ISR and WO for PCT/US07/009271 filed Apr. 12, 2007.

IPRP for PCT/US07/009271 filed Apr. 12, 2007.

IPRP for PCT/US07/009275 filed Apr. 12, 2007.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

Moraja, et al., Advanced Getter Solutions at Wafer Level to Assure High Reliability to the last Generations MEMS, IEEE Reliability Physics Symposium Proceedings, 2003, pp. 458-459.

Sparks, et al. Chip-Level Vacuum Packaging of Micromachines Using NanoGetters, IEEE Transactions on Advanced Packaging, vol. 26 Issue 3, Aug. 2003, pp. 277-282.

Office Action filed in U.S. Appl. No. 11/734,730, dated Jan. 26, 2009.

Office Action dated Aug. 4, 2009 in U.S. Appl. No. 11/734,730.

* cited by examiner

PACKAGING A MEMS DEVICE USING A FRAME

CROSS REFERENCE TO RELATED APPLICATIONS

This application claims priority to U.S. Provisional Application No. 60/791,730, titled "MEMS Devices and Processes for packaging Such Devices," filed Apr. 13, 2006, which is hereby incorporated by reference, in its entirety.

BACKGROUND

1. Field of the Invention

The field of the invention relates to microelectromechanical systems (MEMS). More specifically, the invention relates to MEMS devices having an electrical contact, electrode interconnect structures. One particular application can be found in capacitive MEMS devices. Finally, due to the (semi)-transparent nature of the electrode material in visible light, the invention also relates to optical MEMS devices, in general, and interferometric light modulators in particular.

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF CERTAIN EMBODIMENTS

In one embodiment, a method of manufacturing a microelectromechanical systems (MEMS) based display device is provided, the method including providing a transparent substrate including at least one MEMS device formed thereon, providing a backplate, providing a plurality of seal pieces configured to circumscribe the MEMS device, and forming a MEMS package where the transparent substrate is joined to the plurality of seal pieces, and the seal pieces are joined to the backplate.

In another embodiment, a MEMS based device is provided, including a transparent substrate including at least one MEMS device formed thereon, a frame circumscribing the MEMS device and joined to the substrate, and a backplate sealed to the frame and forming a MEMS device package.

In another embodiment, a MEMS device is provided, including means for supporting a MEMS, the supporting means having a MEMS device formed thereon, means for sealing a MEMS package, and means for spacing the sealing means apart from the supporting means, where the spacing means substantially circumscribes the MEMS device.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Embodiments of the invention relate to the packaging of MEMS devices, such as interferometric modulators by forming a frame of seal pieces around the perimeter of the modulator array. When a backplate is bonded to the frame, excess pressure within the formed package can escape from the corners formed by the seal pieces. Once the package is formed, the edges can be sealed to prevent excess moisture from entering the package and damaging the array.

Figure 1:
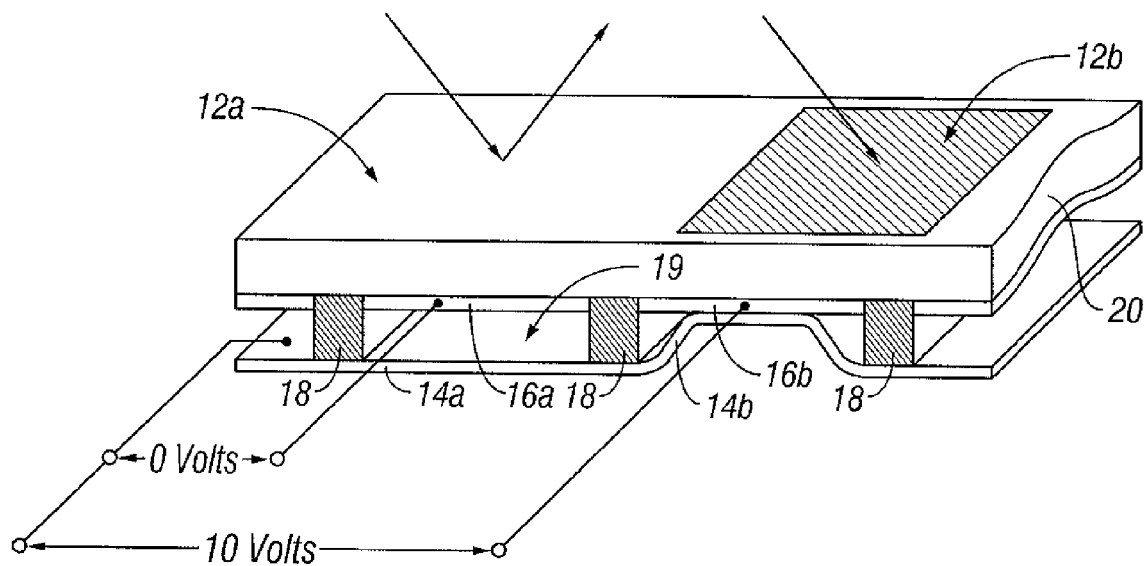
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
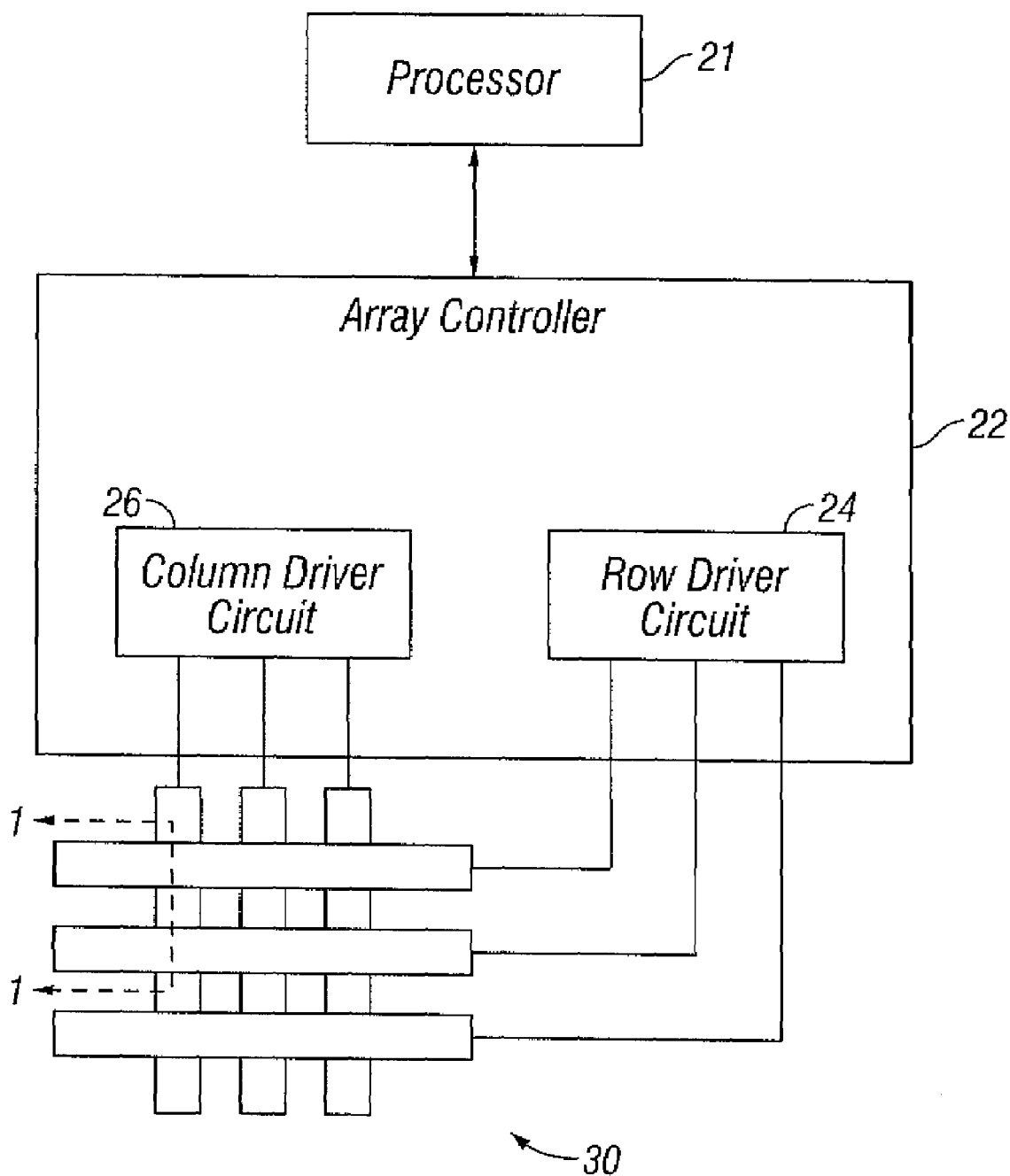
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
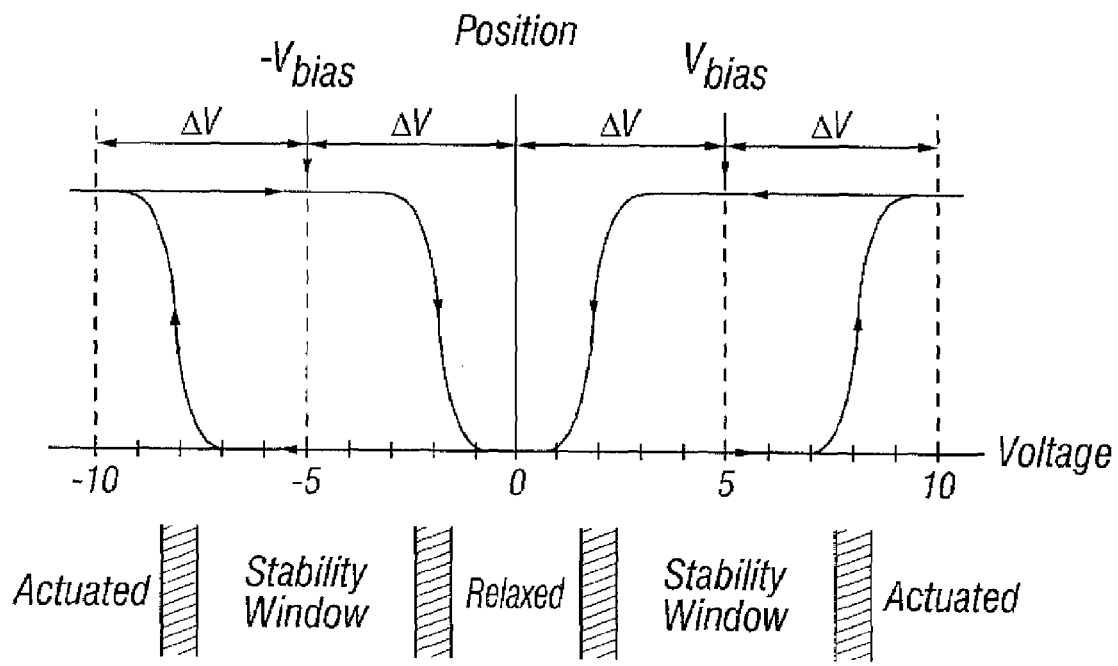
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
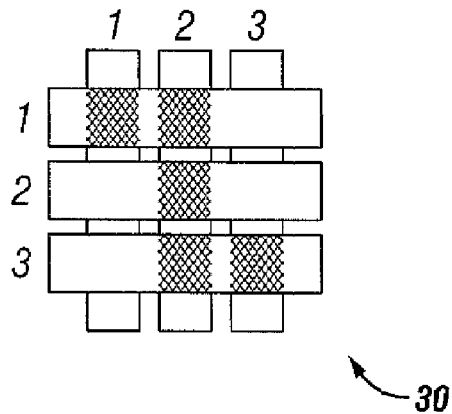
FIG. 5A illustrates one exemplary frame of display data in the 3×3 interferometric modulator display of FIG. 2.
Figure 5B:
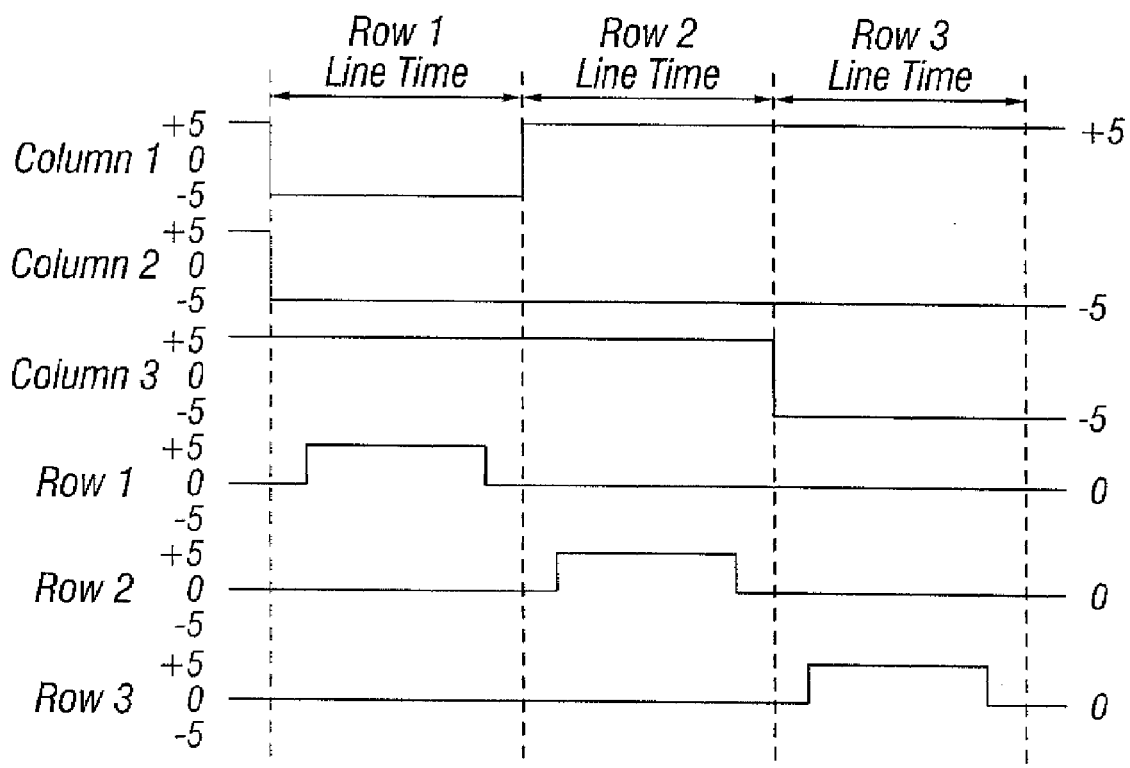
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
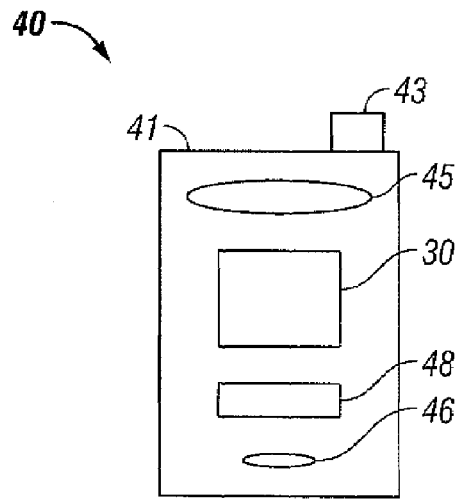
FIGS. 6A and 6B are system block diagrams illustrating an embodiment of a visual display device comprising a plurality of interferometric modulators.
Figure 6B:
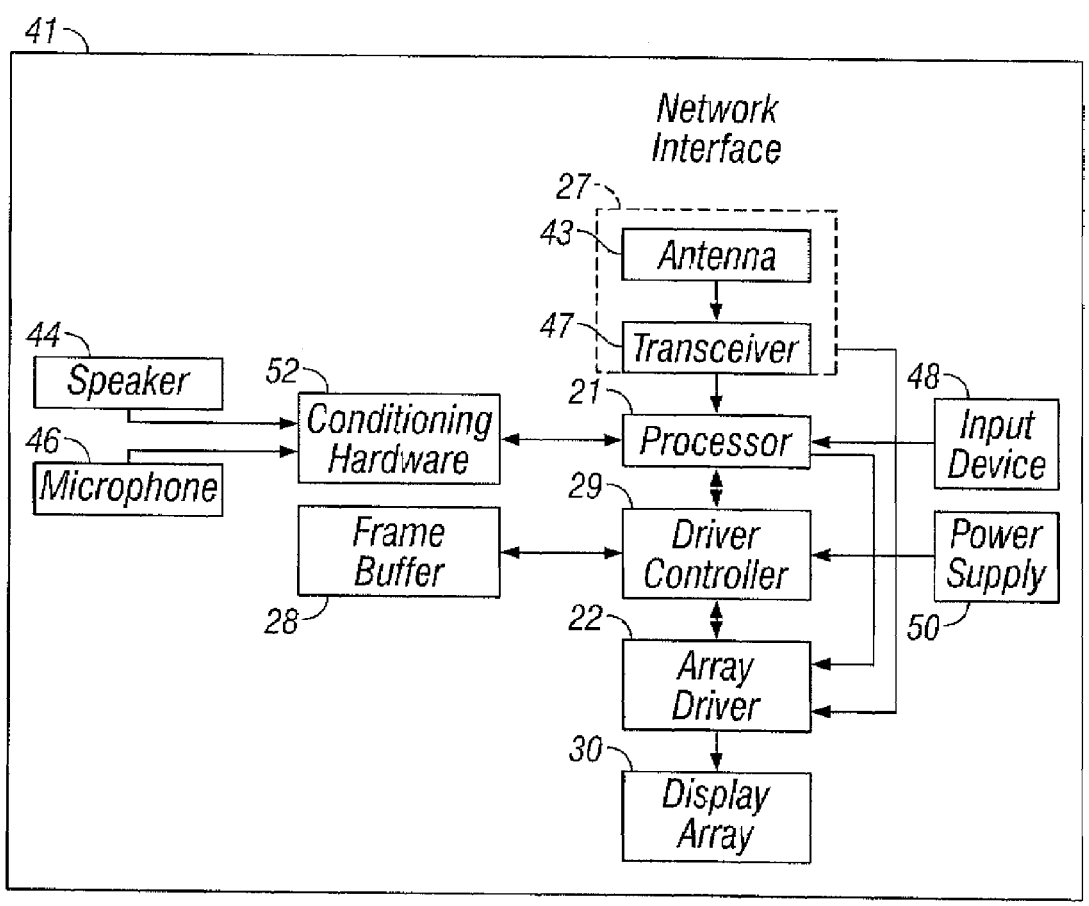

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
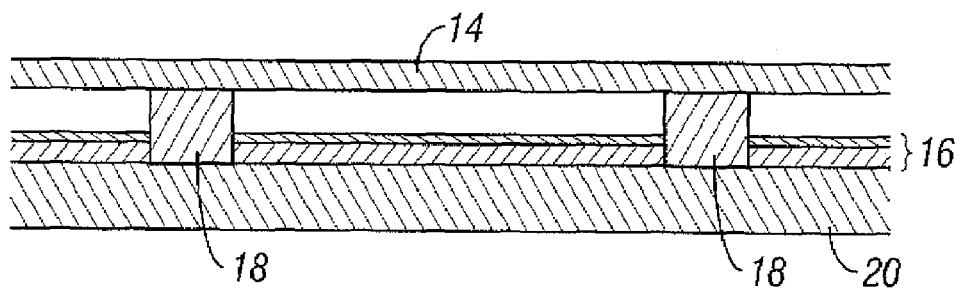
FIG. 7A is a cross section of the device of FIG. 1.
Figure 7B:
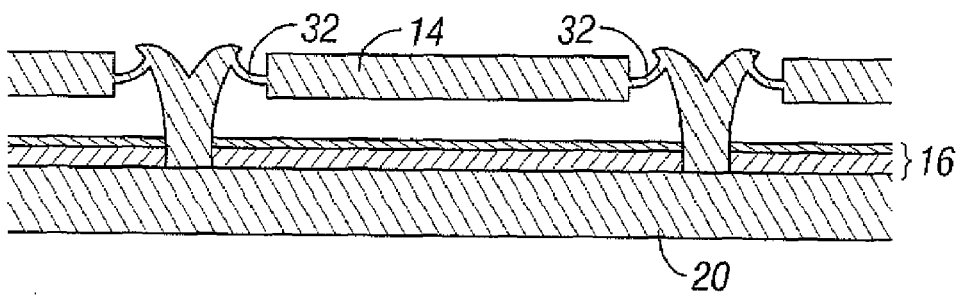
FIG. 7B is a cross section of an alternative embodiment of an interferometric modulator.
Figure 7C:
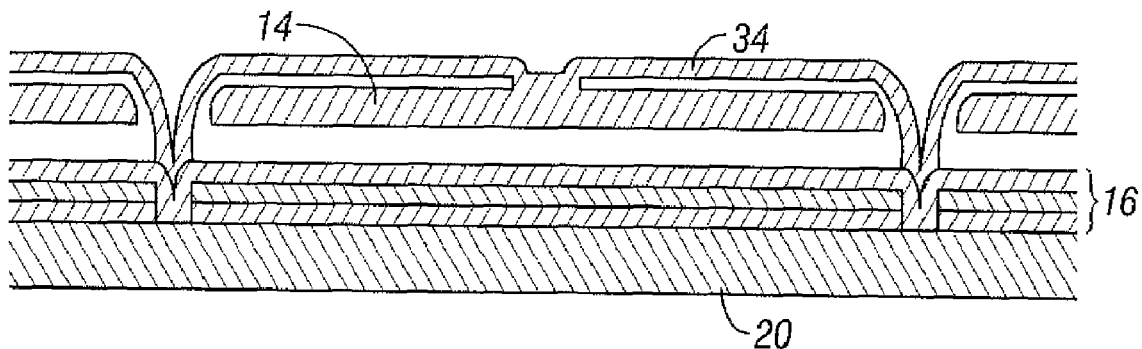
FIG. 7C is a cross section of another alternative embodiment of an interferometric modulator.
Figure 7D:
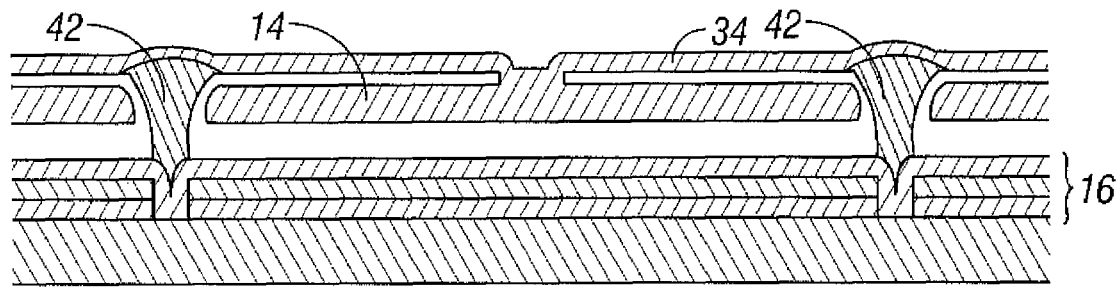
FIG. 7D is a cross section of yet another alternative embodiment of an interferometric modulator.
Figure 7E:
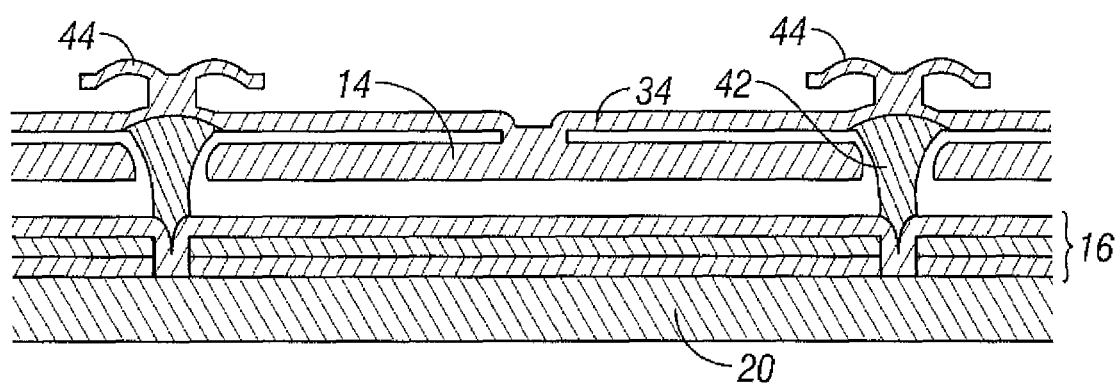
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8:
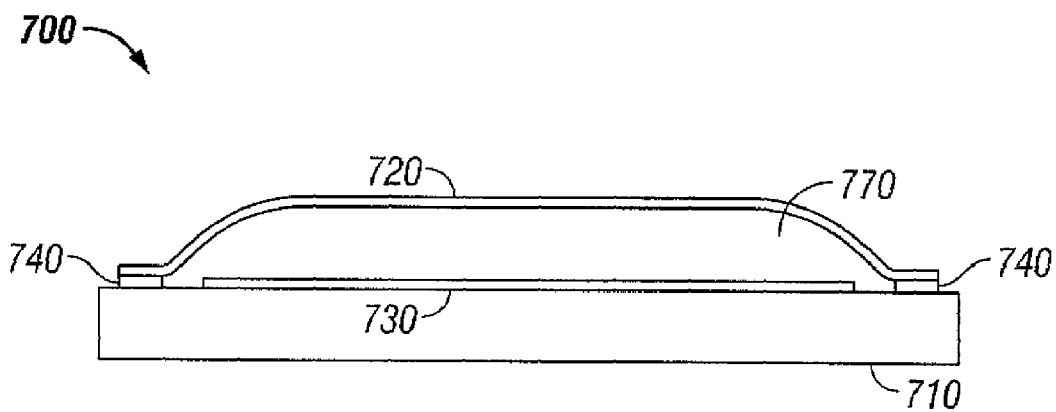
FIG. 8 is a cross-section of a basic package structure.

Packaging techniques for interferometric modulators will be described in more detail below. Interferometric modulators typically include moving parts, such as the movable mirrors 14a, 14b that must have a protected space in which to move. A schematic of a basic package structure 700 for an interferometric modulator is illustrated in FIG. 8. As shown in FIG. 8, a basic package structure 700 includes a transparent substrate 710 and a backplate cover or "cap" 720. As illustrated in FIG. 8, an interferometric modulator array 730 is encapsulated within the package structure 700. The backplate 720 and transparent substrate 710 may be sealed together to protect the interferometric modulator array 730 from harmful elements in the environment.

A method of packaging an interferometric modulator according to the embodiment shown in FIG. 8 will be discussed in more detail below. The packages and packaging methods described herein may be used for packaging any interferometric modulator, including, but not limited to, the interferometric modulators described above.

As discussed above, the interferometric modulator array 730 is configured to reflect light through the transparent substrate and includes moving parts, such as the movable mirrors 14a, 14b of FIG. 1. Therefore, to prevent these parts from being damaged, a gap or cavity 770 may be created between such moving parts and the backplate 720. It will be understood that, in an embodiment, the gap or cavity 770 is created when a backplate 720 having a recessed area is joined to the transparent substrate 710, as shown in FIG. 8.

The transparent substrate 710 may be any transparent substance capable of having thin film, MEMS devices built upon it. Such transparent substances include, but are not limited to, glass, plastic, and transparent polymers. Images are viewed through the transparent substrate 710, which serves as an imaging surface.

In accordance with an embodiment, an interferometric modulator array 730 may be formed on a transparent substrate 710. It will be understood that the fixed mirrors 16a, 16b (of FIG. 1) of the interferometric modulator array 730 are adjacent the transparent substrate 710 and the movable mirrors 14a, 14b are formed over the fixed mirrors 16a, 16b such that the movable mirrors 14a, 14b may move inside the package structure 700 of the embodiment shown in FIG. 8.

To form the interferometric modulator array 730, the transparent substrate 710, in one embodiment, is covered with indium tin oxide (ITO). The ITO may be deposited by standard deposition techniques, including chemical vapor deposition (CVD) and sputtering, for example, to a thickness of about 500 Å. A relatively thin layer of chrome may be deposited over the ITO. The ITO/chrome bilayer is then etched and patterned into columns to form the column electrodes 16a, 16b. A layer of silicon dioxide ($SiO_2$) may be formed over the ITO/chrome columns to create partially reflective fixed mirrors 16a, 16b. A sacrificial layer of, for example, silicon (Si) is deposited (and later released) over the structure to create a resonant optical cavity between the fixed mirrors 16a, 16b and the movable mirrors 14a, 14b. In other embodiments, this sacrificial layer may be formed of molybdenum (Mo), tungsten (W), or titanium (Ti).

Another mirror layer, formed of aluminum, may be deposited over the sacrificial layer of silicon to form the movable mirrors 14a, 14b of the interferometric modulator array 730. This mirror layer is deposited and patterned into rows orthogonal to the column electrodes 16a, 16b to create the row/column array described above. In other embodiments, this mirror layer may comprise reflective metals, such as, for example, silver (Ag) or gold (Au). Alternatively, this mirror layer may be a stack of metals configured to give the proper optical and mechanical properties.

The sacrificial layer is removed, for example, using a gas etching process, after the movable mirrors 14a, 14b are formed to create the optical cavity between the fixed mirrors 16a, 16b and the movable mirrors 14a, 14b. In an embodiment, this sacrificial layer is removed after the backplate is joined to the transparent substrate through an opening in either the backplate or perimeter seal, as will be described in more detail below. Standard etching techniques may be used to remove the sacrificial layer of silicon. The particular release etching will depend on the material to be released. For example, xenon diflouride ($XeF_2$) may be used to remove the silicon sacrificial layer. In another embodiment, the sacrificial layer of silicon between the mirrors 16a, 16b, 14a, 14b is removed before the backplate 720 is joined to the transparent substrate 710. The skilled artisan will appreciate that each layer of the interferometric modulator array 730 may be deposited and patterned using standard deposition techniques and standard photolithographic techniques.

The skilled artisan will understand that the backplate 720 serves a mechanical function, protecting the interferometric modulator array 730 from contaminants in the environment. The backplate 720 along with the transparent substrate 710 and a seal 740 (which is described in more detail below) prevent mechanical interference, moisture, and contaminant gases from reaching and potentially damaging the interferometric modulator array 730 within the package 700. The backplate 720 may therefore be formed of any suitable material, whether transparent or opaque, conductive or insulating. Suitable materials for the backplate 720 include, but are not limited to, glass (e.g., float, 1737, soda lime), plastic, ceramics, polymers, laminates, and metals and metal foils (e.g., stainless steel (SS302, SS410), Kovar, plated Kovar).

A sealing means or a seal 740 is typically provided to join the transparent substrate 710 and the backplate 720 to form the package structure 700. The seal 740 may be a semi-hermetic seal, such as a conventional epoxy-based adhesive. In other embodiments, the seal 740 may be Polyisobutylene (PIB), o-rings, polyurethane, thin film metal weld, liquid spin-on glass, solders, polymers, or plastics, among other types of seals. In still other embodiment, the seal 740 may be a hermetic seal.

In some embodiments, once the backplate 720 and transparent substrate 710 are joined, the seal 740 may be cured and hardened. The skilled artisan will appreciate that the seal 740, which may be hardened, between the backplate 720 and the transparent substrate 710 is different from seals that may be applied after division of the package structure 700 into individual arrays.

It may be desirable to manufacture several arrays of interferometric modulators on a single transparent substrate, apply the backplate, and then divide the structure into individual arrays. Once the seal 740 is hardened, the structure may be mechanically or laser scribed or otherwise prepared for division. Depending on the seal 740, as well as other factors, it may be advantageous, after the division, to apply an endseal to the individual package structures or arrays.

Figure 9A:
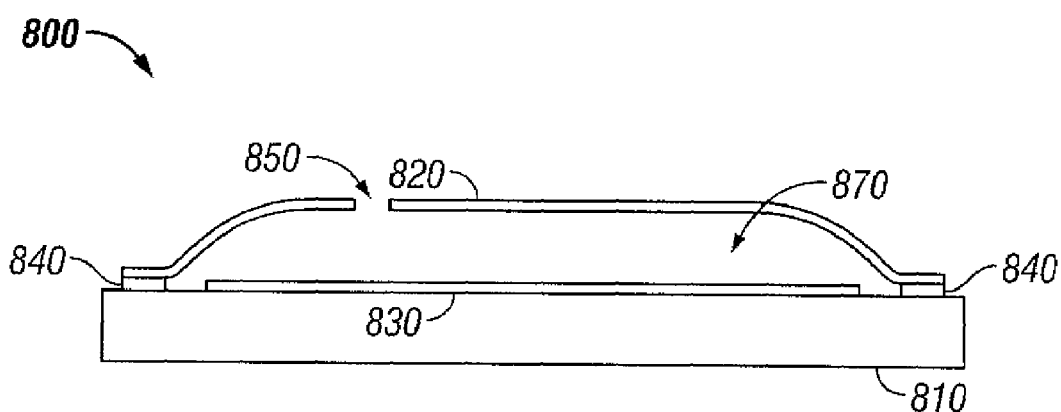
FIG. 9A is a cross-section of a package structure in accordance with an embodiment having an opening in the backplate.
Figure 9B:
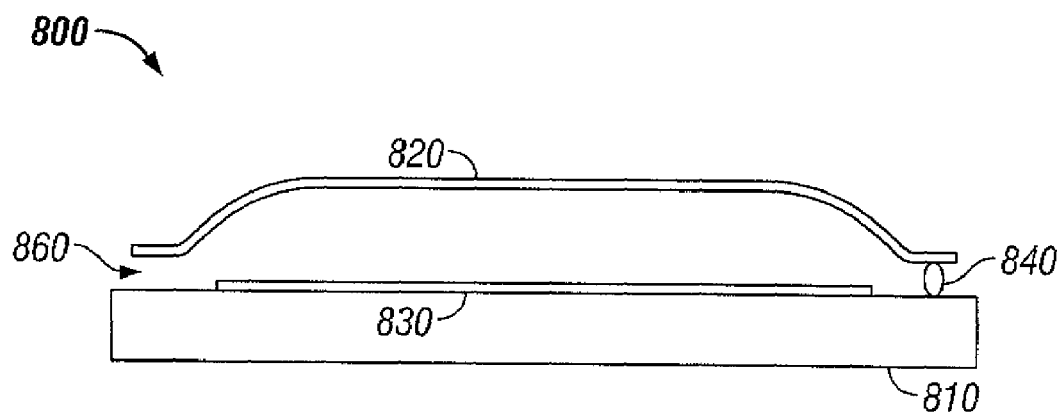
FIG. 9B is a cross-section of a package structure in accordance with an embodiment having an opening in the perimeter seal.

As shown in FIGS. 9A and 9B, the use of openings or holes in the backplate allows packaging to take place in ambient conditions, where the atmospheric conditions are not controlled for the benefit of the manufacturing process. Generally ambient conditions may be the laboratory conditions in a substantially particle-free clean room typically having a temperature around 70° F. and relative humidity in the range of about 40 to about 60%, or about 50%. The openings or holes allow pressure within the package 800 to escape so that the pressure does not cause the transparent substrate 810 and the backplate 820 to come apart during the joining or sealing process because pressure does not build up within the package 800. Allowing the pressure within the package to escape via the openings 850 provides for constant pressure within the package 850, which also allows a more uniform seal width even if the seal is not dispensed with a uniform thickness.

The opening or hole 850 may also be configured to allow material to enter and exit the package 800. In particular, the opening or hole 850 may be configured to allow for application of a solvent to the interferometric modulator array 830 for removal of a spacer or sacrificial layer, which will be described in more detail below. The skilled artisan will understand that an endseal may not be necessary, as will be described in more detail below.

Generally, it is desirable to minimize the permeation of water vapor into the package structure 800 and thus control the environment inside the package structure 800. The package structure 800 may be hermetically sealed to ensure the environment within the package structure 800 remains constant regardless of the surrounding environment. An example of a hermetic sealing process is disclosed in U.S. Pat. No. 6,589,625, the entirety of which is hereby incorporated by reference.

In one embodiment having a hermetic seal, the seal 840 is a hermetic barrier that acts as an environmental barrier preventing all air and water vapor from flowing through the seal 840 and entering the package structure 800. Suitable materials for a hermetic seal include, but are not limited to, welds, solders, adhesives mixed with molecular sieves, such as a zeolite. The adhesive component alone cannot act as a suitable environmental barrier because it will eventually allow moisture and other contaminants to permeate into the package structure 800. A semi-hermetic seal 840 of one of the aforementioned materials is desirable for space-critical environments because the seal 840 can be very thin and inexpensive, relative to other sealing techniques, such as welding and soldering. The semi-hermetic seal 840 may be applied through simple in-line manufacturing processes, whereas the techniques of welding and soldering for hermetic seals require very high temperature processes that can damage the package structure 800, are relatively expensive, and tend to occupy much more space because a welded or soldered seal is thicker. It will be understood that a semi-hermetic seal may include an adhesive that is not mixed with any molecular sieves or desiccants.

In one embodiment, the zeolites may include aluminosilicate-structured minerals, such as sodium aluminosilicate. In another embodiment, the zeolites may include microporous silicate-structured minerals. It will be appreciated that active components, other than zeolites, that can act as absorbing filters on the molecular level can also be used. In one embodiment, the adhesives may be a low outgassing adhesive. In other embodiments, the adhesives may be adhesives with varied outgassing. A desiccant used in the seal may be a calcium dioxide, strontium oxide (SRO), silica gels, montmorillonite clay (such as a magnesium aluminum silicate), molecular sieves (zeolites), or calcium sulfates.

The skilled artisan will understand that the amount of material for the seal 840 will depend on the estimated amount of moisture or contaminant gases that will need to be removed from within the package structure 800 during the lifetime of the package structure 800. The amount of material for the seal 840 also depends not only on the amount of moisture or contaminant gases inside the package structure 800 when the package is formed, but also the permeation rate of the seal 800 and the outgassing potential of the package components.

Zeolites may absorb water molecules at relatively high temperatures. Zeolites can trap moisture and contaminant gases in their pores. The skilled artisan will understand that zeolites having deferent pore sizes can be selected for the seal 840 material to absorb different contaminants. In an embodiment, zeolites are selected to absorb contaminant molecules, such as aromatic branched-chain hydrocarbons that have critical diameters of up to ten angstroms. In another embodiment, zeolites having pore sizes between two and three angstroms may be selected to abort contaminant molecules having diameters of less than two angstroms, such as hydrogen and moisture molecules. In still another embodiment, zeolites having pore sizes of about fifty angstroms (50 Å) can be used to absorb nitrogen and carbon dioxide molecules. The skilled artisan will appreciate that the hermetic seal 840 may be comprised of a mixture of zeolites having various pore sizes.

The seal 840 is typically applied to the transparent substrate 810 along the perimeter, around the interferometric modulator array 830. The skilled artisan will understand that, in an embodiment in which the package structure 800 contains more than one interferometric modulator array 830, the seal 840 is typically applied to the transparent substrate 810 around the perimeter of the of interferometric modulator array 830. In certain embodiments, the seal 840 may be formed to a thickness in a range of about 1 to about 20 microns, or in a range of about 12 to about 18 microns, or about 15 microns. The skilled artisan will appreciate that the thickness of the seal 840 will depend on various factors, including the estimated lifetime of the device, the material of the seal 840, the amount of contaminants and moisture that are estimated to permeate into the package structure 800 during the lifetime, the humidity of the ambient environment, and whether a desiccant is included within the package structure 800 and the flatness of the backplate 820 and the transparent substrate 810. The backplate 820 is then positioned over the transparent substrate 810, and the transparent substrate 810 and the backplate 820 are sealed together by the seat 840 to form the package structure 800.

In some embodiments, an outer bead (not shown) of adhesive is applied around the perimeter of the seal 840. The outer bead may include a low permeation rate adhesive, which can provide additional environmental protection to the package structure 800. The outer bead of adhesive may be useful in an environment having a great deal of contaminants where the seal 840 alone cannot serve as an effective hermetic seal without being loaded with an impractical amount of the active component. For example, if the seal 840 includes a high portion of zeolites (e.g., more than 60 percent zeolites by weight), the seal 840 can become microscopically porous as well as highly viscous and thus difficult to apply. Such a seal 840 having a high portion of zeolites may not provide a robust mechanical support to the package structure 800. The outer bead may also provide additional mechanical support.

As shown in FIG. 9A, the backplate 820 may be formed with at least one opening 850 therein. A release material, such as xenon diflouride ($XeF_2$), may be introduced through the opening into the interior of the package structure 800 to remove the sacrificial layer within the interferometric modulator array 830 (between the fixed mirrors 16a, 16b and the movable mirrors 14a, 14b). The number and size of these openings 850 may depend on the desired rate of removal of the sacrificial layer.

To remove a sacrificial layer of molybdenum (Mo), silicon (Si), tungsten (W), or titanium (Ti), xenon diflouride ($XeF_2$) may be introduced into the interior of the package structure 800 through an opening or openings 850 in the backplate 820. Such openings 850 in the backplate 820 may be created by etching an opening in the backplate 820. The xenon diflouride ($XeF_2$) reacts with the sacrificial layer to remove it. A sacrificial layer formed of spin-on glass or oxide may be gas etched or vapor phase etched to remove the sacrificial layer after the backplate 820 has been joined to the transparent substrate 810. The skilled artisan will appreciate that the removal process will depend on the material of the sacrificial layer.

After the sacrificial layer is removed, the opening(s) 850 in the backplate 820 may be sealed. In an embodiment, a thermally or UV cured polymer is used to seal these openings. The opening(s) may also be sealed with metal or glass caps, metal foil, adhesive, welds, or solder. The skilled artisan will appreciate that other materials may be used as well and that materials having high viscosity are advantageous.

As shown in FIG. 9B, the package structure 800 may have an opening 860 in the perimeter seal 840 rather than, or in addition to, an opening in the backplate 820. The opening 860 in the seal 840 provides the same advantages as those described above for an opening in the backplate 820, including allowing for packaging at ambient conditions, and introduction of a release material, desiccant, and self-aligning monolayer. As with the opening in the backplate, in this embodiment, the opening 860 in the seal 840 may be closed to form a sealed opening after the joining of the transparent substrate 810 and the backplate 820 and introduction of desiccant, release material, and self-aligning monolayer, if desired. In one embodiment, the opening 860 is sealed with a polymer, such as UV or thermally cured. It is advantageous that the polymer has a lower viscosity than that of the perimeter seal 840 such that increase surface tension helps the polymer to fully seal the opening 860.

In another embodiment, following removal of the sacrificial layer and prior to sealing the opening(s) 850, a desiccant can be applied inside the package structure 800 in a vapor form through, for example, the opening(s) 850. In certain embodiments, a portion of a desiccant 860 could be included or applied to the interior surface of the backplate 820, as shown in FIG. 9. In addition, more or other types of desiccants can be applied to the interior of the package 800 through the opening(s) 850. The size of the opening(s) 850 may be small and can thereby allow both high-absorption rate desiccant or slow-absorption rate desiccant to be incorporated into the backplate 820 prior to joining of the backplate 820 to the transparent substrate 810 because the amount of air that will pass into the package 800 through the opening(s) without any vacuum or pressure driving force is sufficiently small. In one embodiment, the opening 850 has a diameter in a range of about 10 to about 100 microns. The opening(s) 850 allow for a desiccant 860 to be incorporated into the backplate 820 prior to assembly and for some gas or etchant to be injected through the opening(s) 850 to either activate the desiccant 860 or to deposit additional desiccant in the package 800.

As noted above, a desiccant may be used to control moisture resident within the package structure 800. However, if the seal 840 is fully hermetic, a desiccant may not be necessary to prevent moisture from traveling from the atmosphere into the interior of the package structure 800.

The elimination of the need for a desiccant also allows the package structure 800 to be thinner, which is desirable. However, in certain embodiments, such as those having a semi-hermetic seal, a desiccant may be advantageous. Typically, in packages containing desiccants, the lifetime expectation of the device may depend on the lifetime of the desiccant. When the desiccant is fully consumed, the interferometric modulator display may fail as sufficient moisture enters the package structure to cause damage to the interferometric modulator. The theoretical maximum lifetime of the device is determined by the water vapor flux into the package as well as the amount and type of desiccant.

It is understood that in an embodiment of the package structure having a hermetic seal, the lifetime of the device is not dependent on the desiccant capacity, or the geometry of the seal. In such a package structure, the interferometric modulator will not fail due to a consumed desiccant.

As mentioned above, a desiccant may be used to reduce moisture resident within the package structure 800. Desiccants may be used for packages that have either hermetic or semi-hermetic seals. In a package having a semi-hermetic seal, a desiccant may be used to control moisture moving into the package from the environment. The skilled artisan will appreciate that a desiccant may not be necessary for a hermetically sealed package, but may be desirable to control moisture within the package structure 800. For packages having hermetic seals, desiccants may be provided within the package to absorb any moisture that moves into the package during the manufacturing process.

Generally, any substance that can trap moisture while not interfering with the optical properties of the interferometric modulator array 830 may be used as the desiccant. Suitable desiccant materials include, but are not limited to, zeolites, molecular sieves, surface adsorbents, bulk adsorbents, and chemical reactants. The skilled artisan will appreciate that the desiccant material should be selected based on a variety of factors, including the estimated amount to contaminant gases in the environment as well as the absorption rate and amount of the desiccant material.

The desiccant may be in different forms, shapes, and sizes. In addition to being in solid form, the desiccant may alternatively be in powder form. These powders may be inserted directly into the package or they may be mixed with an adhesive for application. In an alternative embodiment, the desiccant may be formed into different shapes, such as cylinders or sheets, before being applied inside the package.

Figure 10A:
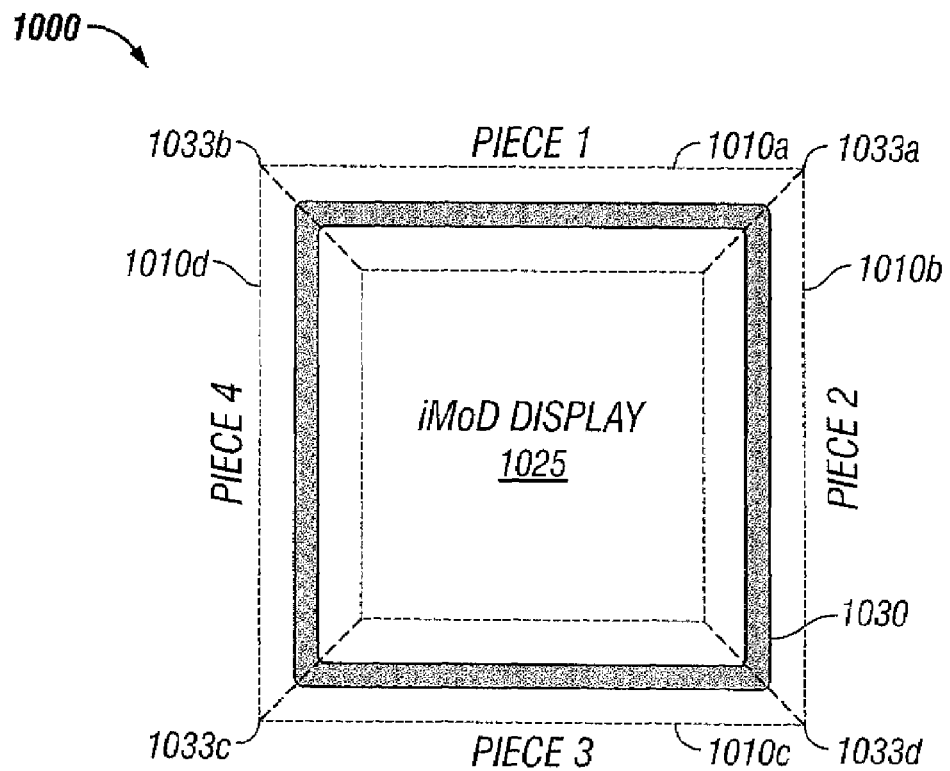
FIG. 10A is a top view of one embodiment of an interferometric modulator array package having a frame of spacers.

Another embodiment is shown in FIG. 10A, wherein a MEMS package 1000 is formed using four seal pieces 1010A-D which circumscribe the periphery of the package 1000. As shown, the seal pieces 1010A-D fit together to form a frame configured to circumscribe an interferometric modulator array 1025. An epoxy bond 1030 holds the four seal pieces 1010A-D together in the frame configuration, and holds the seal pieces 1010A-D to the transparent substrate so as to substantially surround the interferometric modulator array 1025. The epoxy bond 1030 may, for example, be a thermally curable or UV curable epoxy. Of course, embodiments of the invention include any means, as described herein for hermetically or non-hermetically sealing the spacers to the transparent substrate which supports the modulator array. As shown, the frame has four corners 1033A-D which provide an air permeable passageway between the seal pieces from the ambient environment to the interior of a package formed around the modulator array 1025. In one embodiment, these corners are sealed so that the frame provides a hermetic seal around the interferometric modulator array 1025.

Figure 10B:
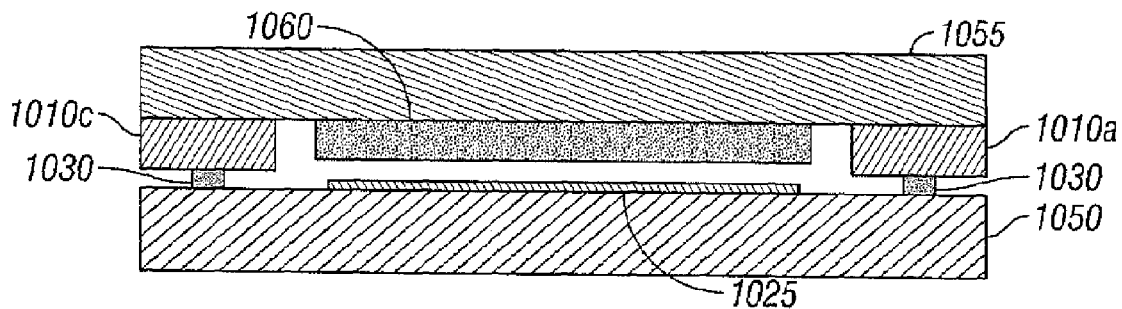
FIG. 10B is a cross-sectional view of the interferometric modulator array from FIG. 10A.

As can be seen in the cross-sectional FIG. 10B of the MEMS package 1000, the four seal pieces 1010A-D bond to a transparent substrate 1050 through the bond 1030. The transparent substrate 1050 supports the interferometric modulator array 1025. The seal pieces support a backplate 1055 which, in one embodiment, includes a desiccant 2360. Thus, in one embodiment, the substrate 1050 provides means for supporting the MEMS array, and the backplate 1055 provides means for sealing a MEMS package. During manufacture, the corners 1033A-D initially function as outlets for relieving excessive air pressure which builds up as the backplate 1055 with desiccant 1060 is attached to the seal pieces. Thus, the edge crevices prevent air pressure from building up within the package during the step of joining the transparent substrate 1050 to the backplate 1055 to form a package, by providing an air permeable passageway extending from the MEMS array in the interior of the package to the ambient environment. Later the edge crevices between the spacers can be sealed by a resin.

In the illustrated embodiment, the frame comprises four seal pieces, and a space between the seal pieces at the corners of the frame may provide an air permeable passageway for relief of the air pressure. However, it will be understood that other configurations are possible. For example, the frame may comprise more or less seal pieces, and air permeable passageways may be provided through one of the seal pieces, rather than between the seal pieces, and may be sealed in the same manner as the edge crevices discussed above.

In one embodiment, the seal pieces are made from glass. However in other embodiments the spacers can be formed from plastic or other materials. Preferably the seal piece materials provide a hermetic seal that prevents moisture from entering the package, once formed. The frame also provides means for spacing the transparent substrate apart from the backplate, so as to provide a cavity in which the MEMS device is protected from mechanical interference.

In some embodiments, a desiccant can be integrated into the frame. For example, once the frame is formed, the desiccant may be on an interior portion of the frame. In some embodiments, one or more of the seal pieces may comprise a desiccant, or may be formed of a desiccant. For example, an internal portion of the frame may be formed of a desiccant material, and an external portion of the frame may be formed of another material, such as glass.

In some embodiments, one or more seal pieces are not applied to the substrate during a first sealing. Accordingly, one or more regions may be left open so that, for example, a desiccant can be introduced into the opening. At a later time, for example, after a second substrate is sealed to the frame, the one or more openings in the seal may be closed with one or more additional seal pieces. The additional seal pieces may comprise or may be formed of a desiccant material. In some embodiments, after a desiccant material is introduced into the opening the opening may be subsequently sealed. The opening may be sealed with, for example, another seal piece, an epoxy material, a metal foil, or a glass piece, any of which may comprise a desiccant, and any of which may be attached to the frame and/or one or both of the substrates with an adhesive. In some embodiments, the opening can be sealed at the time of the application of one or more other seal pieces, where the desiccant is only applied to the inner edge of one or more seal pieces and does not obstruct the planarity of the seal pieces relative to the $1^{st}$ and $2^{nd}$ glass piece. In some embodiments, the second backplate does not comprise a desiccant.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of manufacturing a microelectromechanical systems (MEMS) based display device, the method comprising:
    providing a transparent substrate comprising at least one MEMS device formed thereon;
    providing a backplate;
    providing a plurality of seal pieces configured to fit together to form a frame that circumscribes the MEMS device, wherein the frame has a first bonding surface and a second bonding surface and wherein the frame comprises at least one corner comprising a crevice that provides an air permeable passageway between the seal pieces and allows gas to exit the MEMS device prior to packaging and sealing; and
    forming a MEMS package wherein the transparent substrate is joined to the first bonding surface of the frame with a bonding material disposed between the first bonding surface and the substrate, and the second bonding surface of the frame is joined to the backplate.

2. The method of claim 1, wherein the seal pieces comprise substantially the same material as the transparent substrate.

3. The method of claim 1, wherein the seal pieces comprise glass.

4. The method of claim 1, wherein the seal pieces substantially surround the MEMS device.

5. The method of claim 1, wherein the backplate comprises a desiccant.

6. The method of claim 1, wherein the MEMS package comprises one or more air permeable passageways from the array to the ambient environment.

7. The method of claim 6, wherein the air permeable passageways are formed at one or more junctions of the seal pieces.

8. The method of claim 6, further comprising sealing the one or more air permeable passageways.

9. A device made by the method of claim 1.

10. A microelectromechanical systems (MEMS) based device, comprising:
a transparent substrate comprising at least one MEMS device formed thereon;
a frame circumscribing the MEMS device, wherein the frame comprises a first and a second bonding surface;
one or more air permeable passageways formed at one or more corners of the frame, the one or more passageways configured to allow gas to exit the MEMS device prior to packaging and sealing;
a seal comprising a bonding material disposed between and joining the first bonding surface and the substrate; and
a backplate sealed to the second bonding surface and forming a MEMS device package.

11. The device of claim 10, wherein the frame comprises a plurality of seal pieces.

12. The device of claim 11, additionally comprising one or more air permeable passageways formed at one or more junctions of the seal pieces.

13. The device of claim 12, wherein said air permeable passageways are sealed to prevent air flow through said passageways.

14. The device of claim 10, wherein the frame comprises substantially the same material as the transparent substrate.

15. The device of claim 10, wherein the frame comprises glass.

16. The device of claim 10, wherein the frame is sealed to the transparent substrate via an epoxy ring.

17. The device of claim 10, wherein the backplate comprises a desiccant.

18. The device of claim 10, wherein said at least one MEMS device comprises an interferometric modulator.

19. The device of claim 10, further comprising:
a processor that is in electrical communication with said microelectromechanical system device, said processor being configured to process image data; and
a memory device in electrical communication with said processor.

20. The device of claim 19, further comprising a driver circuit configured to send at least one signal to said microelectromechanical system device.

21. The device of claim 20, further comprising a controller configured to send at least a portion of said image data to said driver circuit.

22. The device of claim 19, further comprising an image source module configured to send said image data to said processor.

23. The device of claim 22, wherein said image source module comprises at least one of a receiver, transceiver, and transmitter.

24. The device of claim 19, further comprising an input device configured to receive input data and to communicate said input data to said processor.

25. A microelectromechanical (MEMS) device, comprising:
means for supporting a MEMS, having a MEMS device formed thereon;
means for enclosing a MEMS package;
a glass frame that substantially circumscribes the MEMS device and comprises a sealed crevice in at least one corner, wherein the sealed crevice is configured to allow gas to exit the MEMS device prior to packaging and sealing; and
means for bonding the frame to the supporting means.

26. The device of claim 25, wherein the enclosing means comprises a backplate.

27. The device of claim 25, wherein the MEMS device comprises an interferometric modulator.

28. The method of claim 1, wherein one or more of the seal pieces comprises a desiccant.

29. The method of claim 1, wherein the seal pieces are glass seal pieces that form said frame.

30. The method of claim 10, wherein the seal pieces comprise four glass seal pieces that form said frame.

31. The device of claim 25, wherein the supporting means comprises a transparent substrate.

32. The device of claim 25, wherein the frame comprises a plurality of seal pieces.

33. The device of claim 32, wherein the seal pieces are solid glass seal pieces that form the frame.

34. The device of claim 32, wherein the seal pieces comprise four glass seal pieces that form the frame.

35. The device of claim 25, wherein the frame has a first bonding surface and a second bonding surface, and wherein the bonding means comprises a bonding material disposed between the first bonding surface of the frame and the supporting means.

36. The device of claim 35, wherein the second bonding surface of the frame is configured to be joined to the enclosing means.

* * * * *